US010326473B2

(12) United States Patent
Bhatia et al.

(10) Patent No.: US 10,326,473 B2
(45) Date of Patent: Jun. 18, 2019

(54) SYMBOL-BASED CODING FOR NAND FLASH DEVICES

(71) Applicant: SK Hynix Inc., Gyeonggi-do (KR)

(72) Inventors: Aman Bhatia, San Jose, CA (US);
June Lee, Sunnyvale, CA (US);
Chenrong Xiong, San Jose, CA (US);
Naveen Kumar, San Jose, CA (US);
Fan Zhang, Fremont, CA (US); Yu Cai, San Jose, CA (US)

(73) Assignee: SK Hynix Inc, Gyeonggi-do (KR)

( * ) Notice: Subject to any disclaimer, the term of this patent is extended or adjusted under 35 U.S.C. 154(b) by 57 days.

(21) Appl. No.: 15/487,231

(22) Filed: Apr. 13, 2017

(65) Prior Publication Data
US 2018/0302104 A1 Oct. 18, 2018

(51) Int. Cl.
| | |
|---|---|
| *G11C 29/00* | (2006.01) |
| *H03M 13/11* | (2006.01) |
| *G06F 11/10* | (2006.01) |
| *G06F 11/30* | (2006.01) |
| *G06F 11/34* | (2006.01) |
| *G11C 11/56* | (2006.01) |
| *G11C 16/08* | (2006.01) |
| *H03M 13/00* | (2006.01) |

(52) U.S. Cl.
CPC ..... *H03M 13/1108* (2013.01); *G06F 11/1072* (2013.01); *G06F 11/3034* (2013.01); *G06F 11/3409* (2013.01); *G11C 11/5628* (2013.01); *G11C 11/5635* (2013.01); *G11C 11/5642* (2013.01); *G11C 16/08* (2013.01); *H03M 13/611* (2013.01)

(58) Field of Classification Search
CPC ............. G06F 11/1072; G06F 11/3034; G06F 11/3409; G06F 11/5628; G11C 11/5642
See application file for complete search history.

(56) References Cited

U.S. PATENT DOCUMENTS

| | | | | |
|---|---|---|---|---|
| 8,644,067 | B2 * | 2/2014 | Jeon .................... | G06F 11/1072 365/185.03 |
| 8,649,215 | B2 * | 2/2014 | Franca-Neto ...... | G11C 16/3495 365/185.02 |

(Continued)

OTHER PUBLICATIONS

Stefan Scholl et al, "ML vs. BP Decoding of Binary and Non-Binary LDPC Codes," 2012, 5 pages.

*Primary Examiner* — Esaw T Abraham
(74) *Attorney, Agent, or Firm* — Kilpatrick Townsend & Stockton LLP

(57) ABSTRACT

Techniques for processing bits associated with an "N" multiple level cell NAND flash memory, such as a QLC NAND flash memory, are described. In an example, a system generates a symbol based on the bits. The symbol corresponds to at least two bits. The system encodes the symbol in a non-binary codeword and stores the non-binary codeword in the "N" multiple level cell NAND flash memory based on a mapping between symbols and voltage levels of the "N" multiple level cell NAND flash memory. The system initializes a non-binary decoding procedure based on asymmetric crossover probabilities between the voltage levels. The asymmetric crossover probabilities are defined based on the mapping between the symbols and the voltage level. The system decodes the non-binary codeword based on the non-binary decoding procedure.

20 Claims, 8 Drawing Sheets

(56) References Cited

U.S. PATENT DOCUMENTS

| | | | |
|---|---|---|---|
| 8,656,263 B2* | 2/2014 | Hu | H03M 13/253 |
| | | | 714/758 |
| 8,660,203 B2 | 2/2014 | Zhou et al. | |
| 8,719,663 B2* | 5/2014 | Li | G06F 11/1072 |
| | | | 714/704 |
| 8,756,481 B2 | 6/2014 | Ware | |
| 8,793,551 B2 | 7/2014 | Zhou et al. | |
| 8,954,820 B2* | 2/2015 | Nemati Anaraki | |
| | | | H03M 13/1111 |
| | | | 714/758 |
| 8,996,958 B2* | 3/2015 | Cideciyan | G06F 11/1072 |
| | | | 714/773 |
| 9,502,117 B2* | 11/2016 | Chen | G11C 16/06 |
| 9,865,353 B1* | 1/2018 | Yassine | G11C 16/3495 |
| 2012/0134446 A1 | 5/2012 | Zhou et al. | |
| 2012/0246395 A1* | 9/2012 | Cho | G06F 12/0246 |
| | | | 711/103 |
| 2016/0125947 A1* | 5/2016 | Yano | G11C 16/16 |
| | | | 365/185.12 |

\* cited by examiner

SLC 210
- L0: 1
- L1: 0

MLC 220
- L0: 11
- L1: 10
- L2: 01
- L3: 00

TLC 230
- L0: 111
- L1: 110
- L2: 101
- L3: 100
- L4: 011
- L5: 010
- L6: 001
- L7: 000

QLC 240
- L0: 1111
- L1: 1110
- L2: 1101
- L3: 1011
- L4: 0111
- L5: 1100
- L6: 1001
- L7: 0011
- L8: 0110
- L9: 0101
- L10: 1010
- L11: 1000
- L12: 0100
- L13: 0001
- L14: 0100
- L15: 1111

| Tx | Rx = 0 | Rx = 1 | Rx = 2 | Rx = 3 |
|----|--------|--------|--------|--------|
| 0  | 1-3P   | P      | 0      | 2P     |
| 1  | P      | 1-3P   | 2P     | 0      |
| 2  | 0      | 2P     | 1-3P   | P      |
| 3  | 3P     | 0      | 0      | 1-3P   |

520 ↙

| Tx | Rx = 0 | Rx = 1 | Rx = 2 | Rx = 3 |
|----|--------|--------|--------|--------|
| 0  | 1-4P   | 2P     | 0      | 2P     |
| 1  | 2P     | 1-4P   | 2P     | 0      |
| 2  | 0      | 2P     | 1-4P   | 2P     |
| 3  | 2P     | 0      | 2P     | 1-4P   |

SYMBOL-BASED CODING FOR NAND FLASH DEVICES

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND

Flash memory is a type of electrically erasable programmable read-only memory (EEPROM) that can be erased and reprogrammed in blocks instead of one byte at a time. The flash storage is made of a large number (in the millions or more) of memory gates (e.g., NAND memory gates) on a die (e.g., a silicon die). The die contains one or more planes. Each plane contains a number of blocks, which are the smallest unit that can be erased. In turn, each block contains a number of pages which are the smallest unit that can be programmed (e.g., written to).

Quad-level cell (QLC) NAND flash devices are a type of flash memories. A QLC NAND flash device stores four bits in a single cell. Such devices are an excellent match for solid-state drive (SSD) products for cold storage applications in data centers. For example, QLC NAND flash devices are expected to provide high density storage at a relatively lower cost and small form factors compared to single, multiple, and triple level cell flash memories. However, the reliability of these devices is challenged by the increase in the number of bits per cell as well as the longer data retention times for cold storage applications.

Error correcting code (ECC) refers to codes that add redundant data, or parity data, to a message, such that the message can be recovered by a receiver even when a number of errors were introduced, either during the process of transmission, or storage. In general, the ECC can correct the errors up to the capability of the code being used. Error-correcting codes are frequently used in communications, as well as for reliable storage in media such as in flash memories.

BRIEF SUMMARY

Techniques for improving the ECC performance of an "N" multiple level cell NAND flash memory, such as a QLC NAN flash memory are described. In an example, symbol-based encoding and decoding is implemented. For instance, bits are mapped to symbols and the symbols are encoded in non-binary codewords. The non-binary codewords are written to the "N" multiple level cell NAND flash memory. Upon a read of a non-binary codeword from this memory, a non-binary decoding procedure is used to determine the symbols from the non-binary codeword. Values of the bits are remapped from the determined values of the symbols. Because non-binary encoding and decoding procedures are used, such procedure improves the ECC performance (e.g., the bit error rate (BER)) relative to binary encoding and decoding procedures.

To further improve the ECC performance, a mapping between the symbols and voltages levels of the N" multiple level cell NAND flash memory is used in the write and read operations. The mapping constraints the order in which the symbols are mapped to the voltage levels. The order creates asymmetric crossover probabilities associated with transitioning between the voltage levels. Soft information based on the asymmetric crossover probabilities are used by the non-binary decoding procedure. Because these probabilities are asymmetric, the BER (or, more precisely, the symbol error rate) performance can be improved.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

FIG. 2 illustrates an example of a prior art bit storage in NAND flash memories.

FIG. 5 illustrates example asymmetric crossover probabilities based on a symbol-voltage level mapping, in accordance with certain embodiments of the present disclosure.

DETAILED DESCRIPTION

Figure 1:
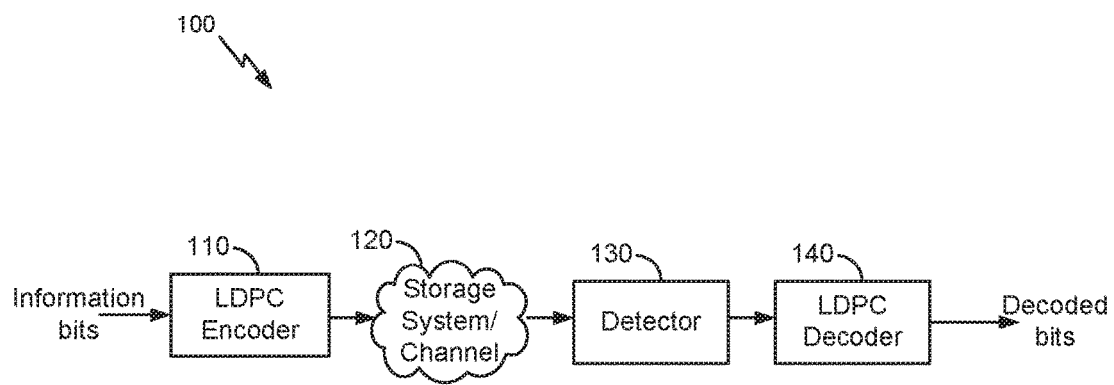
FIG. 1 illustrates an example high level block diagram of an error correcting system, in accordance with certain embodiments of the present disclosure.

The increase in the number of bits per cell of QLC NAND flash memories and data retention times for cold storage applications can impact the ECC performance of such devices. For example, SSD aging sees a slow degradation in the electrical charge, which impacts accuracy of voltage reads. Because a QLC NAND flash memory holds sixteen possible voltage levels, the bit error rate (BER) performance associated with the ECC decoding given the voltage reads can in turn degrade over time.

To improve the ECC performance, non-binary (NB) low-density parity-check (LDPC) codes may be used. Generally, NB-LDPC codes provide performance gains over binary LDPC. An encoder typically encodes symbols, rather than bits, to generate NB-LDPC codes. Each symbol corresponds to at least two bits.

Further, when the channel errors are asymmetric, the gains from using NB-LDPC can be substantially large. These gains can be reflected in the performance of the decoder. Decoding NB-LDPC codes typically involves an NB soft decoder that uses soft information, such as log likelihood ratios. The decoding performance can be improved when the soft information reflects the asymmetric channel errors.

Hence, the ECC performance of a QLC NAND flash memory can be improved based on one or more specific ECC configurations. One specific configuration relates to using symbol-based encoding and decoding. Another specific configuration relates to using soft information that reflects asymmetric channel errors.

As far as symbol-based encoding and decoding, in an embodiment, bits are mapped to symbols, and symbols are mapped to voltage levels. Accordingly, symbols are stored to and read from cells of the QLC NAND flash memory according to the mapping between the symbols and the voltage levels. Once those symbols are decoded according to a NB-LDPC decoding procedure and errors are corrected. The bits can then be decoded by using the mapping between the bits and symbols.

As far as soft information, in an embodiment, asymmetric crossover probabilities are used. A crossover probability refers to a probability of identifying a particular value of a symbol given a voltage read and an actual value of the symbol, where the values correspond, potentially but not necessarily, to two different voltage levels. For instance, the cross over probability can be expressed as $P(Rx=Y|Tx=X)$, where "P" is the probability, "Y" is the particular value of the symbol and corresponds to one voltage level, "X" is the actual value of the symbol and corresponds to the same or a different voltage level, "Rx" is the read value based on a voltage read, and "Tx" is the transmitted or stored value.

To render the crossover probabilities asymmetric, the mapping of the symbols to the voltage levels need to be carefully defined. This mapping constraints the possible symbols that can be stored in a cell of the QLC NAND flash memory to a specific order that creates the asymmetric crossover probabilities. For example, the possible symbols are organized in pairs, where each pair includes two possible symbols and corresponds to a voltage level. The pairs are organized in an order such that the change between two adjacent pairs that correspond to two adjacent voltage levels is limited to one symbol change (e.g., when comparing the four symbols belonging to the two pairs, only one symbol changes between the two pairs). If a voltage read results in a selection of an erroneous voltage level, the correct voltage level is an adjacent level. Thus, by constraining the order of the symbols in the mapping, the likelihood of the correct symbol being an adjacent symbol is larger relative to a non-adjacent symbol. In other words, the crossover probabilities become asymmetric because of the constrained symbol order.

In the interest of clarity of explanation, the embodiments of the present disclosure are described in connection with QLC NAND flash memories. However, the embodiments are not limited as such and similarly apply to other types of flash devices storing more than one bit in a cell. For instance, the embodiments similarly apply to a MLC NAND flash memory, where a symbol that corresponds to two bits is stored in a cell (instead of storing the two bits). Similarly, the embodiments similarly apply to a TLC NAND flash memory, where a symbol that corresponds to three bits is stored in a cell (instead of storing the two bits). Generally, the embodiments cover any "N" multiple level NAND flash memory, where "N" is an integer greater or equal than two (e.g., the storage device is a MLC NAND flash memory when "N" is equal to two, a TLC NAND flash memory when "N" is equal to three, and a QLC NAND flash memory when "N" is equal to four). Generally symbol-based encoding and decoding can be used for an "N" multiple level NAND flash memory by defining a specific mapping between symbols and voltage levels and by relying on asymmetric crossover probabilities. Substantial ECC performance gains can be achieved when "N" is equal to or greater than four.

FIG. 1 illustrates an example high level block diagram of an error correcting system 100, in accordance with certain embodiments of the present disclosure. In the example shown, the system 100 includes an encoder 110, a storage system 120, a detector 130, and a decoder 140. The encoder 110 receives information bits or symbols (where each symbol corresponds to at least two bits) that include data which is desired to be stored in the storage system 120 or transmitted in a communications channel. Encoded data is output by the encoder 110 and is written to the storage system 120. In various embodiments, the storage system 120 may include a variety of storage types or media, such as magnetic disk drive storage, flash storage (e.g., QLC NAND flash memory), etc. In some embodiments, the techniques described herein are employed in a transceiver and instead of being written to or read from storage, the data is transmitted and received over a channel (e.g., wired or wireless). In this case, the errors in the received codeword may be introduced during transmission of the codeword.

When the stored data is requested or otherwise desired (e.g., by an application or a user), the detector 130 receives the data from the storage system 120. The received data may include some noise or errors. The detector 130 performs detection on the received data and outputs a decision and/or reliability information corresponding to one or more bits or symbols in a codeword. For example, a soft-output detector outputs reliability information and a decision for each detected bit or symbol. On the other hand, a hard output detector outputs a decision on each bit or symbol without providing corresponding reliability information. As an example, a hard output detector may output a decision that a particular bit is a "1" or a "0" (e.g., or a two-bit symbol is "1 1," "0 1," "1 0," or "0 1") without indicating how certain the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure the detector is in that decision (e.g., a large magnitude indicates a high reliability or certainty).

The decision and/or reliability information is passed to the decoder 140 which performs decoding using the decision and/or reliability information. A soft input decoder utilizes both the decision and the reliability information to decode the codeword. A hard decoder utilizes only the decision values in the decoder to decode the codeword. After decoding, the decoded bits or symbols generated by the decoder 140 are passed to the appropriate entity (e.g., the user or application which requested it). With proper encoding and decoding, the information bits or symbols match the decoded bits or symbols.

The decoder 140 may implement a number of decoding procedures (e.g., decoding algorithms implemented using application-specific integrated circuit (ASIC), a field-programmable gate array (FPGA), and/or a general purpose processor (e.g., an Advanced RISC Machine (ARM) core) depending on the type of the codeword and whether or not reliability information corresponding to each bit is available. An example decoding procedure includes LDPC decoding. Nonetheless, embodiments of the present disclosure are not limited to this example decoding procedure and similarly to other ones including, for example, turbo code decoding.

In an illustrative example of LDPC decoding, the decoder 140 is an NB-LDPC decoder. NB-LDPC decoding can be used for decoding symbols, where each symbol corresponds to at least two information bits. The decision and/or reliability information is passed to the NB-LDPC decoder which performs NB-LDPC decoding using the decision and reliability information. A soft input decoder utilizes both the decision and the reliability information to decode the codeword. A hard decoder utilizes only the decision values in the decoder to decode the codeword. Generally, the decoding relies on a parity check matrix, which is optimized for the NB-LDPC decoder by design. The information bits can be derived from the decoded symbols based on, for example, a mapping between bits and symbols.

Generally, LDPC codes are linear block codes defined by a sparse parity check matrix H, which consists of zeros and ones. The term "sparse matrix" is used herein to refer to a matrix in which a number of non-zero values in each column and each row is much less than its dimension. The term "column weight" is used herein to refer to number of non-zero values in a specific column of the matrix. The term "row weight" is used herein to refer to number of non-zero values in a specific row of the matrix. If column weights of all of the columns in a parity check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

LDPC codes are usually represented by bipartite graphs. One set of nodes, e.g., the variable nodes, corresponds to elements of the codeword and the other set of nodes, e.g., check nodes corresponds to the set of parity check constraints satisfied by the codewords. Typically the edge connections are chosen at random. The error correction capability of an LDPC code is improved if cycles of short length are avoided in the graph. In a (r,c) regular code, each of the n variable nodes (V1, V2, . . . , Vn) has connections to r check nodes and each of the m check nodes (C1, C2, . . . , Cm) has connections to c variable nodes. In an irregular LDPC code, the check node degree is not uniform. Similarly the variable node degree is not uniform.

From an LDPC parity check matrix, a LDPC generator matrix can be generated. A generator matrix is used to generate LDPC encoded data from the input data. For example, if the input data is represented as u, a 1×(n−m) matrix, and the encoded write data is represented as c (a 1×n matrix) then c=u*G, where "*" is a matrix multiplication. In some cases, a generator matrix (G) is manipulated to be in a special form (i.e., a systematic matrix) where G=[I P] and I is the identity matrix and P is a parity generator matrix. In systematic form, the encoded data (c) includes the input data (u) in its original form. In one example, the encoded data may be the input data (u) followed by the parity bits. Parity data (p) may be obtained from u*P and when combined (e.g., by appending or concatenating) with the input data generates the codeword (i.e., the encoded data).

FIG. 2 illustrates an example of a prior art bit storage in NAND flash memories. Four such memories are illustrated: a single-level cell (SLC) NAND flash memory 210, a multiple-level cell (MLC) NAND flash memory 220, a triple-level cell (TLC) NAND flash memory 230, and a quad-level cell (QLC) NAND flash memory 240. Generally, one or more bits are stored in a cell depending on the type of the NAND flash memory. The storage relies on a mapping that associates a value of a bit (e.g., whether a "0" or a "1") with a voltage level. A voltage level corresponds to a range of voltage such that, if a voltage read falls in the range, this voltage can be declared as belonging to the voltage level.

Specific to the SLC NAND flash memory 210, one bit (e.g., an information bit or a parity bit) can be stored in a cell. Hence, there are two possible voltage levels for the cell. The mapping defines a voltage threshold between these two levels. To check whether the cell contains a "0" or a "1," voltage is read and compared to the voltage threshold to identify the relevant voltage level and, accordingly, the value of the bit. For instance, if the read voltage value is smaller than the voltage threshold, the first voltage level is identified and the bit is determined to be a "1." Otherwise, the second voltage level is identified and the bit is determined to be a "0."

In comparison, for the MLC NAND flash memory 220, two bits can be stored in a cell. Hence, there are four possible voltage levels for the cell. The mapping defines three voltage thresholds between these four levels. To check whether each bit contained in the cell is a "0" or a "1," voltage is read and compared to the three voltage thresholds to identify the relevant voltage level and, accordingly, the bit values.

Similarly, for the TLC NAND flash memory 230 and QLC NAND flash memory 240, three bits and four bits, respectively, can be stored in a cell. Hence, there are eight and sixteen possible voltage levels for the cell for the TLC NAND flash memory 230 and QLC NAND flash memory 240, respectively. The mapping of TLC NAND flash memory 230 defines seven voltage thresholds between the eight voltage levels. The mapping of QLC NAND flash memory 240 defines fifteen voltage thresholds between the sixteen voltage levels. To check whether each bit contained in the cell is a "0" or a "1," voltage is read and compared to the voltage thresholds to identify the relevant voltage level and, accordingly, the bit values.

Hence, the storage capacity per cell increases with an increase in the number of bits stored per cell. However, the latency and accuracy of the reads decreases because of the number of the voltage levels and the voltage range within each level.

Figure 3:
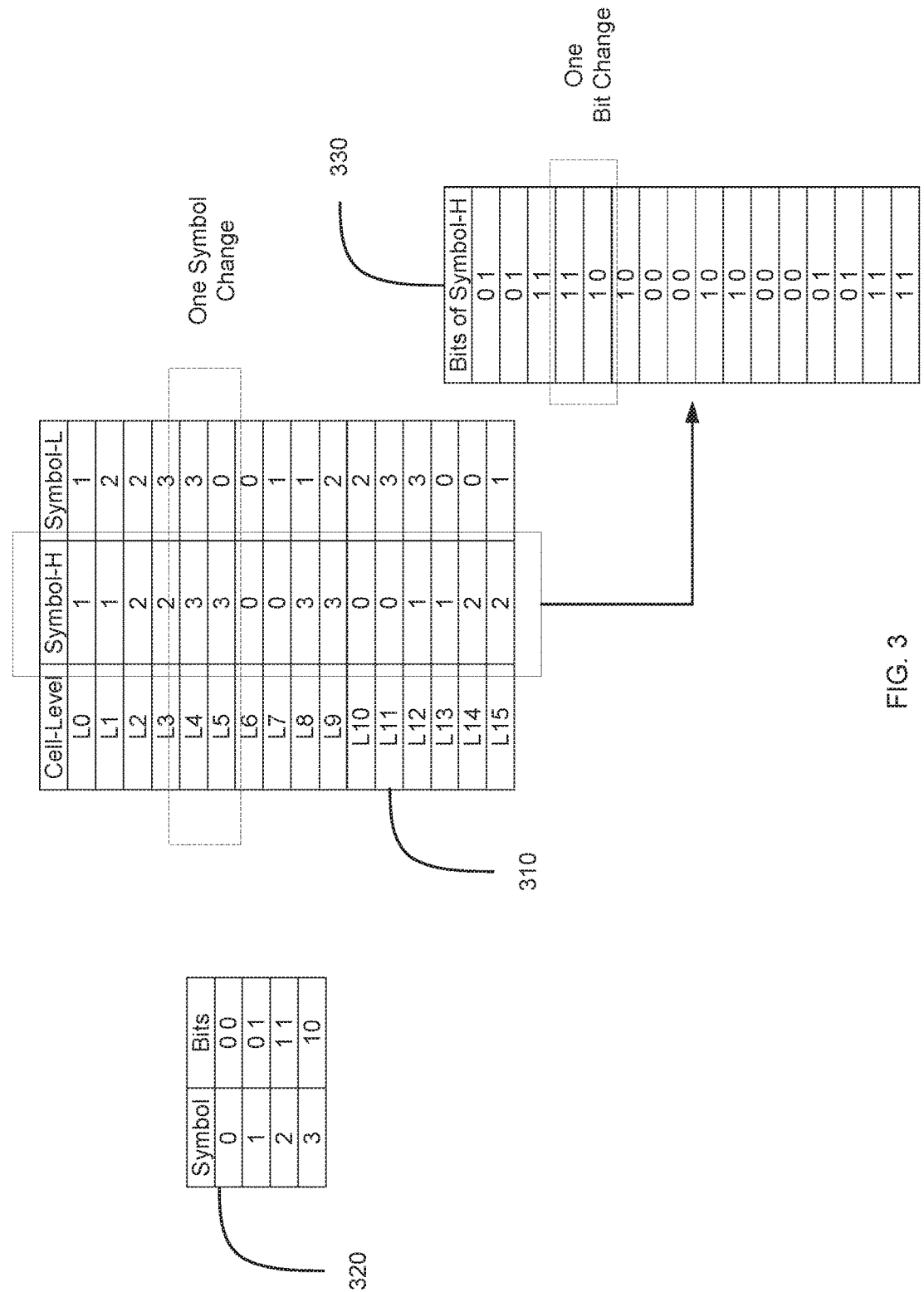
FIG. 3 illustrates an example mapping between symbols and voltage levels, in accordance with certain embodiments of the present disclosure.

FIG. 3 illustrates an example mapping between symbols and voltage levels, in accordance with certain embodiments of the present disclosure. In an embodiment, rather than storing and reading a bit from a cell of NAND flash memory, a symbol is used, where the symbol corresponds to at least two bits. A mapping between the possible symbols and possible voltage levels is defined. This mapping is used to store, read, and decode a codeword that encodes a symbol. Further, the mapping constraints the order of the possible symbols relative to the possible voltage levels to create asymmetric crossover probabilities, which are in turn used for the soft information of a NB soft decoder.

In the illustration of FIG. 3, an example 310 of such a mapping is shown for a QLC NAND flash memory. The four bits that would have been stored in a cell can be combined into two symbols that belong to a same pair. Each symbol corresponds to two of the four bits. Each symbol can take one of four possible values (shown as values {0, 1, 2, 3}). The pair of the two symbols corresponding to the four bits are encoded in non-binary codewords. These codewords are stored in cells of the QLC NAND flash memory.

The example mapping 310 associates voltage levels with possible symbols. Because this symbol-voltage level mapping 310 is specific to a QLC NAND flash memory, there are sixteen voltage levels (shown as "L0" through "L15"). The symbol-voltage level mapping 310 organizes the possible symbols into possible pairs. Each pair includes two symbols (shown as "Symbol-H" and "Symbol-L").

A second mapping 320 is also available. This mapping 320 associates values of bits with values of symbols. For example, "0 0" bits are associated with a "0" symbol, "0 1" bits are associated with a "1" symbol, "1 1" bits are associated with a "2" symbol, and "1 0" bits are associated with a "3" symbol. This bit-symbol mapping 320 is used in the encoding and decoding of the bits to and from the symbols. For example, "0 1" bits are translated into a "1" symbol, which is then encoded in a NB-LDPC codeword. A decoded "2" symbol is translated back into "1 1" bits.

Hence to store four bits of data (whether information bits, parity bits, or a combination thereof) in a cell, two bits of the data are translated into a first symbol and two other bits of the data are translated into another symbol according to the bit-symbol mapping 320. These two symbols form a pair. Each symbol is encoded into a separate NB-LDPC codeword using a NB-LDPC code over a Galois field with four elements. The encoded codewords are written to the QLC flash memory.

To decode the four bits, voltage is read and a detector can use the symbol-voltage level mapping 320 to perform a detection of the symbols in the NB-LDPC codewords and to output decision and/or reliability information corresponding to the symbols. The decision and/or reliability information are used by a decoder, such as one that implements an NB-LDPC decoding procedure, to decode the symbols. The bit-symbol mapping 320 is reused to derive the four bits from the decoded symbols.

To improve the decoding performance, asymmetric crossover probabilities are used by the decoder as part of the soft or reliability information. The crossover probabilities can be rendered asymmetric by a careful design of the symbol-voltage level mapping 310. Specifically, this mapping 310 can constrain the order of the pairs of possible symbols to create the asymmetric crossover probabilities.

A crossover probability is associated with a probability of a read error. Specifically, a voltage read can fall in an erroneous voltage level for different reasons (e.g., read accuracy, voltage range and transitions between the ranges, aging of the QLC flash memory, etc.), which results in identifying an erroneous value for a symbol. For instance, whereas a symbol of "1" was stored in a cell (e.g., as a symbol belonging to an encoded NB-LDPC codeword), a voltage read may result in identifying the symbol as a "2."

In an example, the symbol-voltage level mapping 310 renders the crossover probabilities asymmetric by constraining the changes between the possible symbols relative to the voltage levels. For instance, by design, this constraint can be implemented by ordering the pairs in a way such that the change between two adjacent pairs is limited to no more than one symbol, and by associating the ordered pairs with the different voltage levels. Hence, for symbol values in a pair, the likelihood of erroneously reading these values is biased toward a subset of the voltage levels rather than being equally distributed across these voltage levels.

To illustrate, consider the two adjacent pairs that correspond to the fifth and sixth voltage levels in FIG. 3 (these pairs are shown with a dashed box; the first one includes "3 3" symbols and corresponds to voltage level "L4;" the second one includes "3 0" symbols and corresponds to voltage level "L5"). There is only one symbol change between these two (e.g., the second symbol in each pair changed, but the first symbol stayed the same). This pattern of limiting the changes between adjacent pairs to no more than one symbol value is repeated across the different pairs to create a particular order of the pairs.

Hence, in the illustration of FIG. 3, four bits from each cell can be combined into a pair of symbols (Symbol-H, Symbol-L). Each of Symbol-H and Symbol-L can take values {0,1,2,3}. The symbol-voltage level mapping 310 is created by applying Gray code to the possible symbols and the voltage levels such that values of only one symbol across two adjacent pairs (e.g., pairs mapped to adjacent voltage levels) differ.

Accordingly, user data can be encoded into symbols using a NB-LDPC code over GF(4) (Galois field with four elements) and stored in the Symbol-H page or the Symbol-L page. The Symbol-H page and Symbol-L page are stored together in one word-line (WL) in the QLC NAND flash memory. One-shot programming scheme may be used to write the two pages at the same time. Alternatively, a two-step programming scheme may be used where Symbol-H page is stored, first using the only first eight voltage levels, and the Symbol-H page is read before the Symbol-L page is to be written. This is similar to the two-step programming approach with MLC cells.

To read the Symbol-H page, only eight NAND reads may be needed. Similarly, to read Symbol-L page only seven NAND reads may be needed. This reduces the number of needed page reads, compared to the existing scheme that store bits of a cell into one GF(16) symbol (e.g., storing four bits in a cell). Such existing schemes generally need fifteen NAND device reads. The decoding performance is considerably improved because NB-LDPC codes over GF(4) which are known to provide better error-correction performance and the effective channel for the LDPC codec is asymmetric (e.g., given the asymmetric crossover probabilities). Further, the decoder complexity is much lower for the NB-LDPC decoding, compared to the a binary LDPC code over GF(16).

In a further example, the symbol-voltage level mapping 320 imposes a similar constraint to the order of the bits between two adjacent symbols of a same page (e.g., two adjacent symbols-H or two adjacent symbols-L). For instance, Gray code is also used such that two adjacent symbols-H (or two adjacent symbols-L) in the order differ by only one bit. Such a constraint may further assist with rendering the crossover probabilities asymmetric.

FIG. 3 illustrates this second layer of the constraint for the symbols-H. In particular, the bits corresponding to these symbols are shown as a bit list 330. Two adjacent symbols-H can change by only one bit. For instance, the fourth and fifth symbols are adjacent. The fourth symbol corresponds to "1 1" bits. The fifth symbol corresponds to "1 0" bits. The difference between these two symbols is constrained to a change of the value of the second bit between "1" and "0." The value of the first bit remains the same across the two adjacent symbols.

Figure 4:
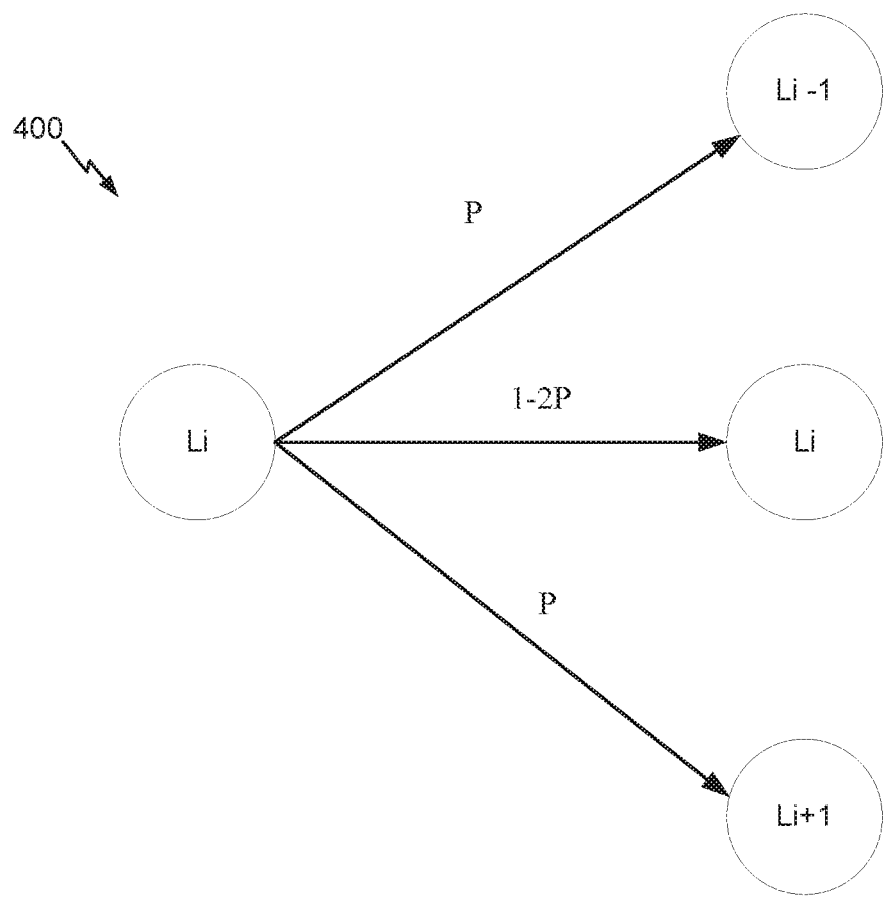
FIG. 4 illustrates an example model of probabilities for transitioning between voltage levels, in accordance with certain embodiments of the present disclosure.

FIG. 4 illustrates an example model 400 of probabilities for transitioning between voltage levels, in accordance with certain embodiments of the present disclosure. The model 400 is based on the symbol-voltage level mapping 310 of FIG. 3 such that these probabilities correspond to asymmetric crossover probabilities.

In an example, noise (e.g., due to endurance or retention) causes the voltage level of a cell to move either one level up or one level down (e.g., to transition to adjacent voltage level as defined in the symbol-voltage level mapping 310). The probability of moving by more than one level is assumed to be zero (e.g., such a transition is very unlikely relative to a one level transition and, thus, is ignored). The model 400 assumes that the probability of the voltage level transition is "P," independent of the correct voltage level, where "P" is a positive real number smaller than one. Hence, for a correct voltage level "Li," the crossover probability for transitioning to either levels "Li−1" or "Li+1" (e.g., the two adjacent voltage levels as ordered in the symbol-voltage level mapping 310) is "P." Accordingly, the probability of correctly reading the voltage level "Li," is "1−2P." Of course for the border voltage levels (e.g., levels "L0" and "L15") there is only one transition at a crossover probability "P" and the probability of a correct read is "1−P."

FIG. 5 illustrates example asymmetric crossover probabilities based on a symbol-voltage level mapping, in accordance with certain embodiments of the present disclosure. If the order of the symbols is constrained, such as illustrated by the symbol-voltage level mapping 310 of FIG. 3, crossover probabilities can be modeled to be asymmetric (e.g., by using the model 400 of FIG. 4).

Crossover probabilities 510 for symbols-H of the symbol-voltage level mapping 310 are shown. Similarly, crossover probabilities 520 for symbols-L of the symbol-voltage level mapping 310 are shown. As illustrated, the crossover probabilities 510 and 520 are not symmetric. Thus, the effective channel for symbols-H and symbols-L is asymmetric. This information (e.g., the asymmetric crossover probabilities 510 and 520) can be used to initialize log-likelihood ratios for the received symbols.

To illustrate, consider the crossover probabilities 510 for a "0" symbol-H (e.g., the first symbol in the table). According to the mapping 310, the "0" symbol-H can be adjacent once to the "1" symbol-H and twice to the "3" symbol-H, but cannot be adjacent to the "2" symbol-H. Hence, the crossover probability between the corresponding voltage levels are "P" for reading a "1" symbol-H and "2P" for reading a "3" symbol-H, "0" for reading a "2" symbol-H, and "1−P−2P=1−3P" for correctly reading the "0" symbol. Because these crossover probabilities are different, they are asymmetric.

Figure 6:
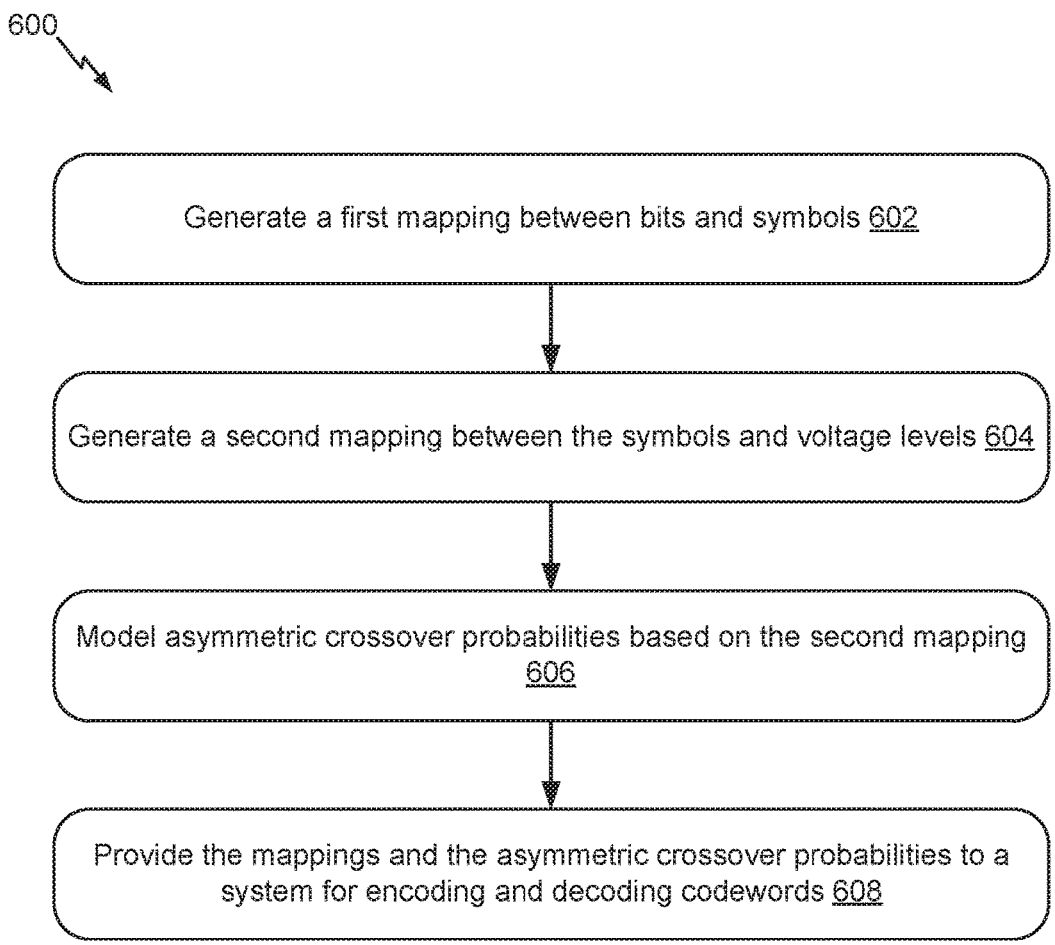
FIG. 6 illustrates an example flow for generating mappings, in accordance with certain embodiments of the present disclosure.

FIG. 6 illustrates an example flow 600 for generating mappings, in accordance with certain embodiments of the present disclosure. These mappings may be generated by design and stored on a system for encoding and decoding codewords, such as the system 100 of FIG. 1. The flow 600 may be performed during a design phase for defining configurations of the encoding and decoding procedures.

The flow 600 starts at operation 602, where a first mapping between bits and symbols is generated. This bit-symbol mapping can be generated depending on the type of a NAND flash memory. In an example, for a QLC NAND flash memory, the four bits that would have been stored to and read from a cell of this memory are mapped to two symbols. Each of the symbols corresponds to two of the four bits. For example, a first symbol (e.g., symbol-H) corresponds to the first two bits. A second symbol (e.g., symbol-L) corresponds to the last two bits. The first symbol and the second symbol form a pair of symbols. Each of these symbols can take one of four values given that it corresponds to two bits. The bit-symbol mapping 320 of FIG. 3 can be used in this example configuration for the QLC NAND flash memory.

At operation 604, a second mapping between the symbols and voltage levels is generated. This symbol-voltage level mapping can be generated depending on the type of the NAND flash memory. In an example, for the QLC NAND flash memory, sixteen voltage levels per cell are possible. In this example, the symbol-voltage level mapping associates the sixteen voltage levels with sixteen possible pairs of symbols, where each pair contains a first symbol that corresponds to two bits (e.g., a symbol-H) and a second symbol that corresponds to two other bits (e.g., a symbol-L), where the four bits would have been otherwise written to a cell. The symbol-voltage level mapping can also be generated based on a constraint that limits the change between symbols of adjacent pairs to only one symbol value. By limiting the change, the constraint creates asymmetric crossover probabilities associated with transitioning between the voltage levels. The constraint can also limit the changes between bits within adjacent symbols (e.g., between two adjacent symbols-H or between two adjacent symbols-L) to one bit value. Gray code can be used to impose such limits on the pair-to-pair change and symbol-to-symbol change. The symbol-voltage level mapping 310 of FIG. 3 can be used in this example configuration for the QLC NAND flash memory.

At operation 606, asymmetric crossover probabilities are modeled based on the second mapping. In an example, a crossover probability is modeled as a probability "P" for a transition between two different voltage levels corresponding to two adjacent pairs in the symbol-voltage level mapping, to zero for a transition between two different voltage levels corresponding to non-adjacent pairs, and as a probability of "1−ΣP" for staying within a same voltage level. The model 400 of FIG. 4 and the resulting crossover probabilities 510 and 520 of FIG. 5 can be derived from the symbol-voltage level mapping 310 of FIG. 3 for the QLC NAND flash memory.

At operation 608, the first mapping, second mapping, and the asymmetric crossover probabilities are provided to the system for encoding and decoding codewords. For example, the system stores these mappings and probabilities. The system becomes capable of mapping bits of user data to pairs of symbols, encoding the symbols using an NB encoding procedure such as NB-LDPC encoding, writing and storing the encoded codewords to the QLC NAND flash memory, reading the encoded codewords from the QLC NAND flash memory, initializing an NB decoder (e.g., such as one use NB-LDPC decoding) based on the asymmetric crossover probabilities, decoding the encoded codewords by using the NB decoder to determine the symbols, and remapping the determined symbols to bits of the user data.

Figure 7:
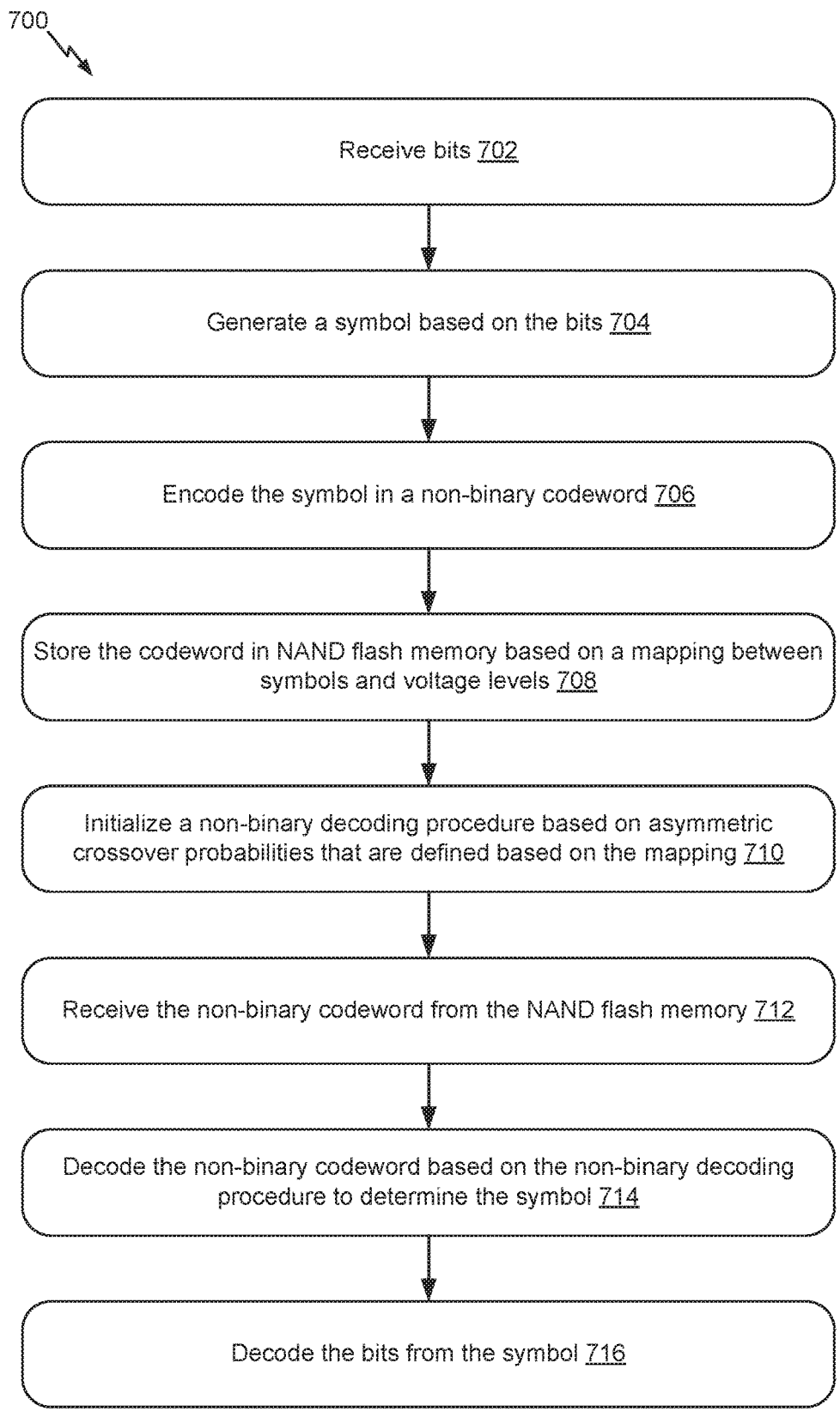
FIG. 7 illustrates an example flow for processing bits associated with "N" multiple level cell NAND flash memory, in accordance with certain embodiments of the present disclosure.

FIG. 7 illustrates an example flow 700 for processing bits associated with an "N" multiple level cell NAND flash memory, in accordance with certain embodiments of the present disclosure. A system, such as the system 100 of FIG. 1, may be configured to perform the flow 700. Instructions for performing the operations of the flow 700 can be stored as computer-readable instructions on a non-transitory computer-readable medium of the system. As stored, the instructions represent programmable modules that include code or data executable by a processor of the system. The execution of such instructions configures the system to perform the specific operations shown in the figures and described herein. While the operations are illustrated in a particular order, it should be understood that no particular order is necessary and that one or more operations may be omitted, skipped, and/or reordered. Further, in the interest of clarity of explanation, the flow 700 is described in connection with the processing of a single symbol generated from the bits. However, the operations of the flow 700 can be repeated to process a plurality of symbols.

The flow 700 starts at operation 702, where the system receives bits. In an example, the bits represent user data that should be stored in a QLC NAND flash memory.

At operation 704, the system generates a symbol based on the bits. In an example, for the QLC NAND flash memory, the symbol corresponds to at least two bits of the received bits. The system generates the system based on a bit-symbol mapping, such as the bit-symbol mapping 320 of FIG. 3.

At operation 706, the system encodes the symbol in a non-binary codeword. For example, an NB-LDPC encoding procedure is applied to the symbol and to other symbols to generate an NB-LDPC codeword.

At operation 708, the system stores the non-binary codeword in the QLC NAND flash memory based on a mapping between symbols and voltage levels of the QLC NAND flash memory, such as the symbol-voltage level mapping 310 of FIG. 3. In this way, a cell stores an encoded symbol, rather than four bits, according to a particular voltage level. In an example, the system writes the encoded symbol in the cell according to the association between the value of this symbol and the relevant voltage level as defined in the mapping.

At operation 710, the system initializes a non-binary decoding procedure based on asymmetric crossover probabilities between the voltage levels. The asymmetric crossover probabilities are defined based on the mapping between the symbols and the voltage levels. In an example, the asymmetric crossover probabilities 510 and 520 of FIG. 5 are used for the QLC NAND flash memory. The non-binary decoding procedure generally uses soft information, such as log likelihood ratios (LLRs) and can include NB-LDPC decoding. The soft information is set based on the asymmetric crossover probabilities. For instance, the LLRs are expressed as functions of such probabilities (or, as functions of the probabilities "P" used to define the crossover probabilities, as illustrated in asymmetric crossover probabilities 510 and 520 of FIG. 5). The value of "P" need not be known or actually used as the LLRs are ratios. Nonetheless, the actual value or a random value may be used for "P." The random value can be set randomly as a positive real integer less than one. In some situations, the QLC flash memory may include bad cells, bad word lines, or bad bit lines. The locations of such cells or lines can be known and identifiers of these locations can be stored on the system. The reliability information and/or information possible voltage transitions of these locations can also be known. The crossover probabilities for a bad cell (or a cell in a bad word line or bad bit line) can be initialized based on the information about the bad cell such as based on the relevant reliability information and the voltage transition information.

At operation 712, the system receives the non-binary codeword from the NAND flash memory. For example, voltages are read and symbol decision and reliability information are outputted.

At operation 714, the system decodes the non-binary codeword based on the non-binary decoding procedure to determine the symbol (and, similarly, the other symbols that were encoded in the NB codeword). In an example, the NB-LDPC decoding procedure uses the soft information that was initialized based on the asymmetric crossover probabilities to output the symbol.

At operation 716, the system decodes the bits from the determined symbol. For example, the system uses the bit-symbol mapping to identify the values of the at least two bits that correspond to the determined symbol.

Figure 8:
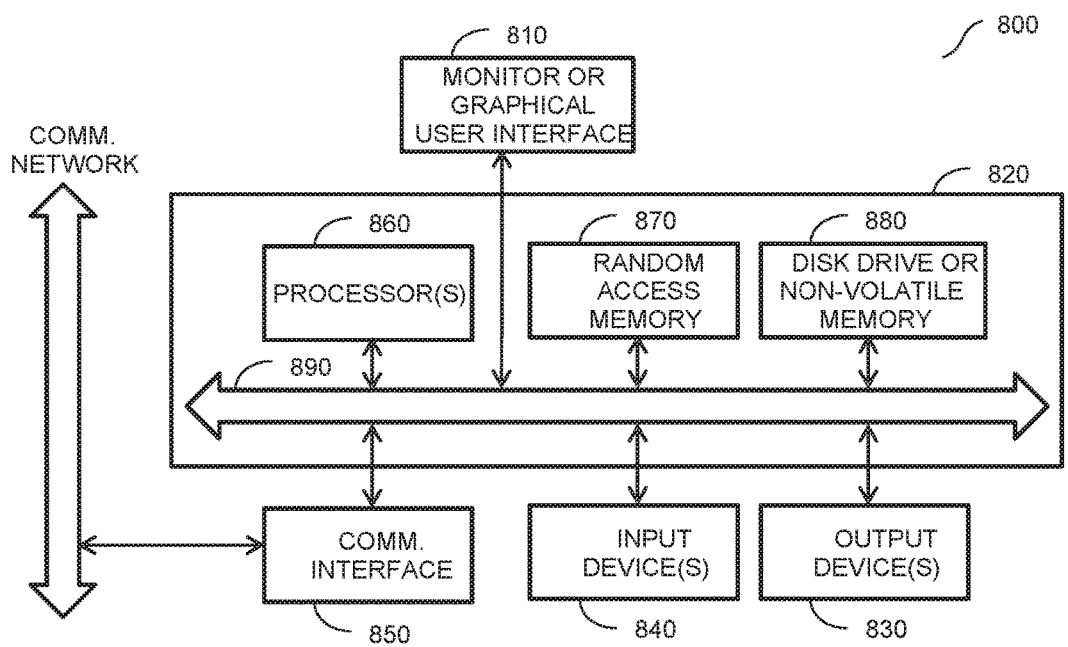
FIG. 8 is representative of a computer system capable of embodying the present disclosure.

FIG. 8 describes one potential implementation of a system, which may be used according to one embodiment, such as the system 100 of FIG. 1. FIG. 8 is merely illustrative of an embodiment of the present disclosure and does not limit the scope of the disclosure as recited in the claims. In one embodiment, the system is a computer system 800 that typically includes a monitor 810, a computer 820, user output devices 830, user input devices 840, communications interface 850, and the like. The system 100 of FIG. 1 implements some or all of the components of the computer system 800.

As shown in FIG. 8, the computer 820 may include a processor(s) 860 that communicates with a number of peripheral devices via a bus subsystem 890. These peripheral devices may include the user output devices 830, the user input devices 840, the communications interface 850, and a storage subsystem, such as random access memory (RAM) 870 and disk drive 880.

The user input devices 840 include all possible types of devices and mechanisms for inputting information to the computer system 820. These may include a keyboard, a keypad, a touch screen incorporated into the display, audio input devices such as voice recognition systems, microphones, and other types of input devices. In various embodiments, the user input devices 840 are typically embodied as a computer mouse, a trackball, a track pad, a joystick, a wireless remote, a drawing tablet, a voice command system, an eye tracking system, and the like. The user input devices 840 typically allow a user to select objects, icons, text and the like that appear on the monitor 810 via a command such as a click of a button or the like.

The user output devices 830 include all possible types of devices and mechanisms for outputting information from the computer 820. These may include a display (e.g., the monitor 810), non-visual displays such as audio output devices, etc.

The communications interface 850 provides an interface to other communication networks and devices. The communications interface 850 may serve as an interface for receiving data from and transmitting data to other systems. Embodiments of the communications interface 850 typically include an Ethernet card, a modem (telephone, satellite, cable, ISDN), (asynchronous) digital subscriber line (DSL) unit, FireWire interface, USB interface, and the like. For example, the communications interface 850 may be coupled to a computer network, to a FireWire bus, or the like. In other embodiments, the communications interfaces 850 may be physically integrated on the motherboard of the computer 820, and may be a software program, such as soft DSL, or the like.

In various embodiments, the computer system 800 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 820 includes one or more Xeon microprocessors from Intel as the processor(s) 860. Further, one embodiment, the computer 820 includes a UNIX-based operating system.

The RAM 870 and the disk drive 880 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 870 and the disk drive 880 may be configured to store the basic programming and data constructs that provide the functionality of the present disclosure.

Software code modules and instructions that provide the functionality of the present disclosure may be stored in the RAM 870 and the disk drive 880. These software modules may be executed by the processor(s) 860. The RAM 870 and the disk drive 880 may also provide a repository for storing data used in accordance with the present disclosure.

The RAM 870 and the disk drive 880 may include a number of memories including a main random access memory (RAM) for storage of instructions and data during program execution and a read only memory (ROM) in which fixed non-transitory instructions are stored. The RAM 870 and the disk drive 880 may include a file storage subsystem providing persistent (non-volatile) storage for program and data files. The RAM 870 and the disk drive 880 may also include removable storage systems, such as removable flash memory.

The bus subsystem 890 provides a mechanism for letting the various components and subsystems of the computer 820 communicate with each other as intended. Although the bus subsystem 890 is shown schematically as a single bus, alternative embodiments of the bus subsystem may utilize multiple busses.

FIG. 8 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A method of processing bits associated with an "N" multiple level cell NAND flash memory, the method comprising:
    generating, by a system, a symbol based on the bits, wherein the symbol corresponds to at least two bits;
    encoding, by the system based on a non-binary encoding procedure of an encoder of the system, the symbol in a non-binary codeword;
    storing, by the system, the non-binary codeword in the "N" multiple level cell NAND flash memory based on a mapping between symbols and voltage levels of the "N" multiple level cell NAND flash memory;
    initializing, by the system, a non-binary decoding procedure of a decoder of the system based on asymmetric crossover probabilities between the voltage levels, wherein the asymmetric crossover probabilities are defined based on the mapping between the symbols and the voltage levels; and
    decoding, by the system, the non-binary codeword based on the non-binary decoding procedure, wherein the non-binary decoding procedure uses soft information that is defined based on the asymmetric crossover probabilities.

2. The method of claim 1, wherein "N" is equal to four, wherein the symbol is a first symbol from a pair of symbols, wherein the pair comprises a second symbol, and wherein the first symbol and the second symbol are encoded as non-binary codewords that are stored in a cell of the "N" multiple level cell NAND flash memory.

3. The method of claim 2, wherein the mapping maps sixteen possible voltage levels to sixteen possible pairs of first symbols and second symbols.

4. The method of claim 3, wherein the mapping constraints an order of the sixteen possible pairs, wherein the order is constructed by using a Gray code, and wherein two adjacent pairs in the order differ by only one symbol.

5. The method of claim 3, wherein the mapping constraints an order of the first symbols in the pairs, wherein the order is constructed by using a Gray code, and wherein two adjacent first symbols in the order differ by only one bit.

6. The method of claim 1, wherein the encoding uses non-binary low density parity check code (NB-LDPC) encoding.

7. The method of claim 6, wherein the non-binary decoding procedure uses NB-LDPC decoding, wherein the soft information is used in the initialization of the NB-LDPC decoding.

8. The method of claim 1, wherein the crossover probabilities comprise a probability of reading a particular value of the symbol given an actual value of the symbol.

9. The method of claim 1, wherein the crossover probabilities are initialized as functions of a probability value "P," and wherein in the decoding, the probability value "P" is initialized to a random value less than one.

10. The method of claim 1, wherein the "N" multiple level cell NAND flash memory comprises a bad cell, and wherein the crossover probabilities are initialized based on information about the bad cell.

11. The method of claim 1, further decoding the at least two bits from the symbol based on another mapping between the bits and the symbols.

12. A system, comprising:
a processor; and
a memory comprising computer-readable instructions that, upon execution by the processor, cause the system to at least:
generate a symbol based on bits, wherein the symbol corresponds to at least two bits;
encode the symbol in a non-binary codeword based on a non-binary encoding procedure; and
store the non-binary codeword in a "N" multiple level cell NAND flash memory based on a mapping between symbols and voltage levels of the "N" multiple level cell NAND flash memory, wherein the mapping creates asymmetric crossover probabilities between the voltage levels by constraining changes between an order of the symbols in the mapping, wherein soft information for a non-binary decoding procedure is defined based on the asymmetric crossover probabilities.

13. The system of claim 12, wherein the execution of the computer-readable instructions further cause the system to at least:
initialize the non-binary decoding procedure based on the asymmetric crossover probabilities between the voltage levels; and
decode the non-binary codeword based on the non-binary decoding procedure.

14. The system of claim 13, wherein the encoding uses non-binary low density parity check code (NB-LDPC) encoding, wherein the non-binary decoding procedure uses NB-LDPC decoding, wherein the soft information is used in the initialization of the NB-LDPC decoding.

15. The system of claim 12, wherein "N" is equal to four, wherein the symbol is a first symbol from a pair of symbols, wherein the pair comprises a second symbol, and wherein the first symbol and the second symbol are encoded as non-binary codewords that are stored in a cell of the "N" multiple level cell NAND flash memory.

16. The system of claim 15, wherein the mapping maps sixteen possible voltage levels to sixteen possible pairs of first symbols and second symbols.

17. The system of claim 16, wherein the mapping constraints an order of the sixteen possible pairs, wherein the order is constructed by using Gray coding, and wherein two adjacent pairs in the order differ by only one symbol.

18. A non-transitory computer storage medium storing instructions that, upon execution by a processor of a system, cause the system to perform operations comprising:
receiving a non-binary codeword that encodes a symbol that corresponds to at least two bits based on a non-binary encoding procedure, wherein the non-binary codeword is received from an "N" multiple level cell NAND flash memory, and wherein the "N" multiple level cell NAND flash memory stores the non-binary codeword based on a mapping between symbols and voltage levels of the "N" multiple level cell NAND flash memory;
initializing a non-binary decoding procedure based on asymmetric crossover probabilities between the voltage levels, wherein the asymmetric crossover probabilities are defined based on the mapping between the symbols and the voltage levels; and
decoding the non-binary codeword from the "N" multiple level cell NAND flash memory based on the non-binary decoding procedure, wherein the non-binary decoding procedure uses soft information that is defined based on the asymmetric crossover probabilities.

19. The non-transitory computer storage medium of claim 18, wherein "N" is equal to four, wherein the symbol is a first symbol from a pair of symbols, wherein the pair comprises a second symbol, and wherein the first symbol and the second symbol are encoded as non-binary codewords that are stored in a cell of the "N" multiple level cell NAND flash memory.

20. The non-transitory computer storage medium of claim 19, wherein the mapping maps sixteen possible voltage levels to sixteen possible pairs of first symbols and second symbols.

* * * * *